US007505696B2

(12) United States Patent
Day

(10) Patent No.: US 7,505,696 B2
(45) Date of Patent: Mar. 17, 2009

(54) OPTICAL RECEIVER WITH INCREASED DYNAMIC RANGE

(75) Inventor: Chris J. Day, Sebastapool, CA (US)

(73) Assignee: TriAccess Technologies, Inc., Santa Rosa, CA (US)

( * ) Notice: Subject to any disclaimer, the term of this patent is extended or adjusted under 35 U.S.C. 154(b) by 485 days.

(21) Appl. No.: 11/200,576

(22) Filed: Aug. 10, 2005

(65) Prior Publication Data
US 2006/0034622 A1    Feb. 16, 2006

Related U.S. Application Data

(60) Provisional application No. 60/601,018, filed on Aug. 12, 2004.

(51) Int. Cl.
*H04B 10/06* (2006.01)
(52) U.S. Cl. .................. 398/208; 398/202; 398/210; 375/345
(58) Field of Classification Search .................. 398/71, 398/208–211, 214; 375/317, 345
See application file for complete search history.

(56) References Cited

U.S. PATENT DOCUMENTS

| 4,139,767 | A |  | 2/1979 | Witkowicz |
|---|---|---|---|---|
| 4,998,012 | A |  | 3/1991 | Kruse |
| 5,013,903 | A |  | 5/1991 | Kasper |
| 5,095,286 | A |  | 3/1992 | Cole et al. |
| 5,239,402 | A |  | 8/1993 | Little, Jr. et al. |
| 5,347,389 | A |  | 9/1994 | Skrobko |
| 5,430,568 | A |  | 7/1995 | Little et al. |
| 5,481,389 | A | * | 1/1996 | Pidgeon et al. ............. 398/208 |
| 5,703,530 | A |  | 12/1997 | Sato et al. |
| 6,242,732 | B1 |  | 6/2001 | Rantakari |
| 6,570,430 | B1 |  | 5/2003 | Zhou |
| 6,674,967 | B2 |  | 1/2004 | Skrobko |
| 7,215,721 | B2 | * | 5/2007 | Hietala et al. ............... 375/317 |
| 2003/0202802 | A1 | * | 10/2003 | Doh et al. ................... 398/202 |
| 2006/0165413 | A1 | * | 7/2006 | Schemmann et al. .......... 398/71 |

FOREIGN PATENT DOCUMENTS

JP            06-224652       *  8/1994

OTHER PUBLICATIONS

Childs, et al., "AM Video Distribution System with a 64-Way Passive Optical Splitting", IEEE Photonics Technology Letters, vol. 4, No. 1, Jan. 1992.
Zand, et al, "Trans-impedance Amplifer with Differential Photodiode Current Sensing", Proceedings of the 1999 IEEE International Symposium of Circuits and Systems.

* cited by examiner

*Primary Examiner*—Ken N Vanderpuye
*Assistant Examiner*—Li Liu
(74) *Attorney, Agent, or Firm*—Reed Smith LLP

(57) ABSTRACT

An optical receiver with increased dynamic range includes a photodetector, a photodetector biasing network, an amplifier and a post-distortion network. The post-distortion network compensates for gain error in the amplifier, such that a composite output voltage is relatively linear with respect to input current. The dynamic gain responses of the amplifier and the post-distortion network are equal in magnitude and opposite in phase. Additionally, a signal from at least one internal node of the amplifier may be connected to the post-distortion network, in order to further improve performance.

4 Claims, 7 Drawing Sheets

A = Voutput / Vinput

Voutput = ~ -Rfb (large A)

(Ieqt)^2 = 4kTB / Rfb

OPTICAL RECEIVER WITH INCREASED DYNAMIC RANGE

BACKGROUND OF THE INVENTION

This application claims the benefit of U.S. Provisional Application No. 60/601,018, filed Aug. 12, 2004, entitled OPTICAL RECEIVERS AND AMPLIFIERS FOR LINEAR BROADBAND DISTRIBUTION SYSTEMS, the disclosure of which is herein incorporated by reference.

FIELD OF THE INVENTION

The present invention relates generally to circuits for optical receivers, and more particularly to a design for an optical receiver having increased dynamic range.

DESCRIPTION OF THE RELATED ART

The delivery of video services over communication systems such as Hybrid-Fiber-Coax (HFC), Fiber-To-The-Curb (FTTC), and Fiber-To-The-Home (FTTH) often necessitates the use of high dynamic range technologies to support legacy analog NTSC signal formats. These video systems all use amplitude modulated (AM) optical carriers and require an optical transmitter to modulate the information onto the light. They also require an optical receiver to demodulate and amplify the signal for use by customer premise terminals, such as set top boxes or NTSC television sets.

A basic optical link used in an analog RF video delivery system is shown in FIG. 1. In this case, an FTTP analog RF system is shown, but the principles are equally applicable to HFC or FTTC systems. An optical transmitter takes in a multi-channel signal and amplitude modulates (AM) a light source in a linear fashion. The content can be standard NTSC analog TV channels or digitally modulated carriers such as used in cable modem systems. This system is primarily designed to carry video services, but quite often is used to carry advanced digital services such as high-speed data and telephony. The output of the optical transmitter provides an input to an Erbium Doped Fiber Amplifier (EDFA), which greatly increases optical power levels without adding significant noise or distortion. The EDFA high power output is then fanned out by means of an optical splitter to provide signal to a number of customers. Typically the fan-out or split ratio is 1:32 or 1:64. The amplitude-modulated optical signal is then demodulated into an electrical signal by a photo-detector, which functions as an envelope detector on the incoming light. A trans-impedance amplifier provides electrical gain such that the resulting signal is suitable for distribution to customer premise equipment, or to further coaxial distribution systems.

In these systems, the optical dynamic range at the receiver input is the difference between the maximum optical input level before the onset of distortion, less the minimum optical input level before noise degrades signal quality. In the case of analog RF video signals, either excessive distortion or excessive noise will degrade customers' viewing experience. Consequently, video system architects spend considerable time optimizing their systems around distortion and noise performance, and an optimum system design will carefully balance the distortion and noise performance against cost.

Because of the spatial diversity of customers and the variable nature of optical link budgets in typical deployments, optical path losses can widely vary. For instance, fiber runs will be longer in rural areas than in urban environments. Depending on the specific optical plant deployed, the number and locations of loss elements such as patch panels and splices will vary. To make wide-scale deployments over a large range of optical plants easier it is very desirable to have an optical receiver able to operate over a wide optical dynamic range. For instance, in some three-wavelength FTTP systems now in the early stages of deployment, the desired optical loss budget is between 10 to 28 dB. Unfortunately, optical receivers for the 1550 nm wavelength video portions of the FTTP system only support about 7 or 8 dB of dynamic range. The small optical dynamic range of video optical receivers can make FTTP deployments more difficult since more effort must be expended to meet the relatively narrow optical input window. A wider 1550 nm wavelength video receiver dynamic range will make FTTP deployments easier.

Thus, one of the key goals presented to the designer of analog RF optical receivers is to increase the usable optical dynamic range. As stated, this involves two elements. While the noise and distortion must be within acceptable limits over the entire specified optical input range, generally two corner conditions form the basis for the design. First, the receiver must not cause significant distortion when the input optical condition is large. Minimizing distortions in any amplifier can be accomplished by a number of means such as increasing the size of active transistor devices inside the amplifier. Unfortunately larger transistor active area leads to increased power consumption and cost. Another technique to minimize distortions is to apply multi-device amplifier topologies that can have inherently lower distortion. The familiar cascode topology is commonly used for this purpose and has two transistors. Second, the receiver must not contribute significant noise when the input condition is low. Minimizing noise likewise involves a careful selection of circuit topology and bias conditions. Minimizing noise is often done by maximizing the value of key resistors in the circuit such as the primary shunt feedback resistors used in broadband circuits.

It is important to note with regard to the design that distortion and noise are different concepts. That is, a design specifically optimized for good distortion performance will have degraded noise performance, compared with a design which targets low noise. Similarly, a design specifically optimized for low noise performance will have comparatively worse distortion than a design optimized for distortion. In most cases, the principle task of the design is to carefully balance the noise and distortion of the receiver while holding costs to a minimum.

It is also worth mentioning that poor distortion and noise performance affect systems differently depending on the type of content transmitted. For example, a system carrying QAM modulated digital information will be quite sensitive to distortion effects such as clipping, but less sensitive to noise effects when compared with an analog NTSC signal. Noise and distortion are not the same, but rather must be carefully balanced in the design.

FIG. 2 illustrates the tradeoff between noise and distortion. FIG. 2 shows a generalized trans-impedance amplifier design which includes a high gain Amplifier A having voltage gain from Vin to Vout of A. It's assumed that the Amplifier A has near infinite input impedance. A shunt feedback resistor, Rfb, regulates the output voltage of the trans-impedance amplifier by feeding back a portion of the output signal to the input. It can be shown that the trans-impedance gain, Ztia, of the circuit is:

$$Ztia = Vout/Iin = Rfb * A/(1-A) = \sim -Rfb \text{ (large A)}$$

The quantity, Iin, is the input current provided by a photo-detector when it is illuminated. The value of Iin is determined by the input optical power and the responsivity of the photodiode. The range of Iin the circuit experiences is then a direct result of the optical dynamic range. The output voltage, Vout, is significant in that the Amplifier A must provide reasonable linearity up to the Vout level indicated by:

$$Vout=Iin*Rfb*A/(1-A)$$

$$Vout=\sim-Iin*Rfb \quad \text{(large A)}$$

$$Vout(max)=\sim-Iin\,(max)*Rfb \quad \text{(large A)}$$

For a given range of input optical powers, the maximum Vout is then directly set by the value of Rfb. The amount of distortion generated in the circuit will depend on the non-linear characteristics of Ztia with respect to Iin. The non-linear relationship between Vout and Iin can be described as a power series:

$$Vout(Iin)=m1*Iin+m2*(Iin)^2+m3*(Iin)^3+\text{higher order terms}$$

Here m1 and m2 are the standard power series coefficients for the $1^{st}$, $2^{nd}$, and $3^{rd}$ order responses, respectively, of the complete trans-impedance amplifier in FIG. 2. The $1^{st}$ order term m1 is just the value trans-impedance gain, which is approximately equal to −Rfb. The $2^{nd}$ and $3^{rd}$ order and higher order terms are then the distortion products generated by trans-impedance amplifier non-linearities. It follows that as the input current Iin increases, the amount of distortion generated relative to the $1^{st}$ order term will increase. The feedback resistor Rfb provides linearization of these distortion products through negative feedback action. The smaller the value of Rfb, the more shunt feedback occurs in the circuit, and the lower the distortion. Alternatively, as Rfb increases the distortion occurring in Voutput will increase since there is less negative feedback. Raising Rfb leads directly to an increase in distortion.

The equivalent input noise of a trans-impedance amplifier is the sum of all noise sources within the trans-impedance amplifier lumped into a single equivalent noise current source, Ieqt, placed at the input in parallel with the photo-detector. Although photo-detector impedances can influence Ieqt, no photo-detector noise sources (such as shot noise) are included in Ieqt. Assuming that Amplifier A is noise-less, the only noise source contributing to the equivalent input noise is that of Rfb. For amplifiers fabricated from field-effect devices (FET), this is a useful approximation due to the high input impedance and very low noise performance FET devices offer. It is not a good approximation for amplifiers fabricated from bipolar junction devices (BJT) due to the comparatively high base current and correspondingly high shot noise. Assuming photo-detector impedance is infinite, Ieqt of the circuit in FIG. 2 is the thermal noise associated with Rfb:

$$(Ieqt)^2=4kTB/Rfb$$

For example, a feedback resistor of 1000 ohms will generate 4 pA/rtHz of equivalent input noise. Thus, we would like to increase Rfb to achieve the lowest noise performance. However, as previously stated, a larger Rfb implies that a larger output voltage Vout must be supported with good distortion characteristics by our Amplifier A. When Vout increases, so does the distortion generated in Amplifier A. This leads to a direct trade-off between noise and distortion performance in the circuit of FIG. 2.

One of the primary methods for improving this tradeoff involves a push-pull topology in which two separate amplifiers are operated 180 degrees out of phase with respect to each other (FIG. 3). Outputs from these separate amplifiers are added together in a push-pull signal combiner such as a transformer or balun shown in FIG. 3. This approach is described in R. B Childs, T. A. Tatlock, and V. A. O'Byrne; "*AM Video Distribution System with a 64-Way Passive Optical Splitting*", IEEE Photonics Technology Letters, Vol. 4, No. 1, January 1992. In this design, a photo-detector's two outputs are used to drive two separate amplifiers, whose outputs are combined with a transformer.

Much the same technique is also covered in detail in Little, Jr, et al, U.S. Pat. No. 5,239,402, as well as follows on works by Skrobko, U.S. Pat. No. 5,347,389 and U.S. Pat. No. 6,674,967. The basic elements of these approaches all include a photo-detector, two separate amplifiers, and a means for coupling the amplifier outputs in a push pull fashion.

The advantages of this push-pull approach are twofold. First, because thermal noise contributions of each feedback resistor Rfb and Amplifier are independent from one another, noise power from these sources will be additive at the output. In addition, the push-pull operation of the circuit insures that the desired signal's output voltage will be additive through the output transformer. It can be shown that the net effect of this is to reduce the Ieqt of the push-pull implementation to be sqrt(2) of that from each half. For example, a pair of 1000 ohm feedback resistors will generate 2.82 pA/rtHz of equivalent input noise in a push-pull design. The second advantage of the push-pull approach is that $2^{nd}$ order distortion terms can be made to cancel provided the circuit in FIG. 3 maintains complete balance. Any imbalance of current flow into the separate amplifiers, or imbalance in the power series characteristics of the amplifiers, or imbalance in the characteristics of the push-pull combiner, will lead to a direct loss of $2^{nd}$ order cancellation. Should this imbalance become too large, the noise reduction properties will also degrade.

While the circuit in FIG. 3 improves noise and $2^{nd}$ order distortion, it requires an output balun or transformer to combine outputs. Output transformers are typically wound using bifilar wire around appropriately sized ferrite cores to achieve the desired bandwidth. Winding of baluns and transformers is labor intensive and therefore expensive. The circuit in FIG. 4 overcomes much of this by combining signals in an active differential amplifier, as contained in Witkowicz, U.S. Pat. No. 4,139,767. In this implementation, the noise performance of the full receiver will be sqrt(2) lower than that caused by each separate amplifier, and the $2^{nd}$ order distortion produced in the 2 input amplifiers will cancel in the output differential amplifier. However, $2^{nd}$ order distortions emanating in the differential amplifier output stage will not cancel without an output transformer or balun device, as in U.S. Pat. No. 5,239,402. In this regard, the design in U.S. Pat. No. 4,139,767 is both distinctly different from, and is inferior to, U.S. Pat. No. 5,239,402. However, U.S. Pat. No. 4,139,767 is easier to implement in an integrated circuit (IC) since it does not require a ferrite wound balun or transformer, and therefore can be made with significant cost advantages over U.S. Pat. No. 5,239,402.

In summary, balancing noise, distortion, and cost are the primary challenges in the design of optical receivers. A push-pull technique has been useful in improving noise and distortion by adding a completely separate $2^{nd}$ amplifier.

SUMMARY OF THE INVENTION

According to one embodiment of the present invention, an optical receiver with increased dynamic range includes a photodetector, a photodetector biasing network, an amplifier and a post-distortion network. The post-distortion network compensates for gain error in the amplifier, such that a composite output voltage is relatively linear with respect to input current. As measured at the output of the receiver, the dynamic gain responses of the amplifier and the post-distortion network are designed to be equal in magnitude and opposite in phase. Additionally, a signal from at least one internal node of the amplifier may be connected to the post-distortion network, in order to further improve performance.

In specific embodiments, the amplifier may comprise a trans-impedance amplifier, a differential trans-impedance amplifier, or a dual trans-impedance amplifier.

According to a preferred method of the present invention, the dynamic range of an optical receiver may be increased by detecting an optical signal with a photodetector, the photodetector biased with a biasing network, applying an output current from the photodetector to an amplifier, and applying an output signal from the amplifier to a post-distortion network, wherein the post-distortion network compensates for gain error in the amplifier, such that a composite output voltage is relatively linear with respect to input current. The method may further comprise applying a signal from at least one internal node of the amplifier to the post-distortion network, in order to further improve performance.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

According to the present invention, distortion of an optical receiver may be improved by adding a non-linear post-distortion block to the output of the trans-impedance amplifier. The post-distortion block may be designed in such a way as to generate non-linearities which are of equal magnitude but opposite phase of those originating in the trans-impedance amplifier, thereby resulting in cancellation between the two non-linearities. This results in a more linear optical receiver.

An inherently more linear receiver provides valuable design freedom such that the value of primary feedback resistor may be increased to reduce noise in the receiver without harming overall distortion performance. In other words, by introducing linearization into the trans-impedance amplifier itself, a lower noise trans-impedance amplifier can be built by increasing the value of primary feedback resistor.

Linearization of amplifiers has been much studied and applied to wireless networks. Linearization works by sensing the dynamic circuit voltage or current condition in an amplifier, and developing and applying a voltage or current with the aim of re-aligning the gain of the amplifier to an ideal state. Very often the gain of an amplifier decreases with increasing signal input, a phenomenon known as "gain-compression". Linearization can be thought of as gain re-alignment of the amplifier. For example, as the gain of the amplifier decreases with increased signal level, resulting in distortion, a linearizing element can be used to increase the net gain of the amplifier such that the addition of the gain compression and linearization brings the gain back to a constant level.

Figure 1:
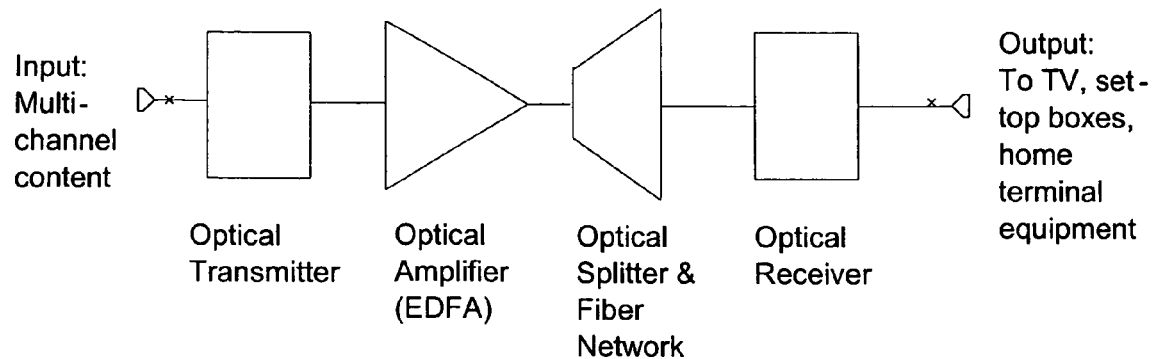
FIG. 1 is a block diagram of a standard optical link system.
Figure 2:
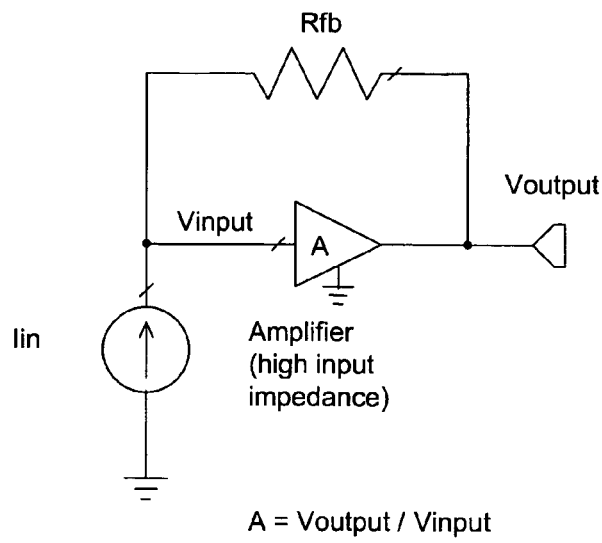
FIG. 2 is a generalized trans-impedance amplifier design.
Figure 3:
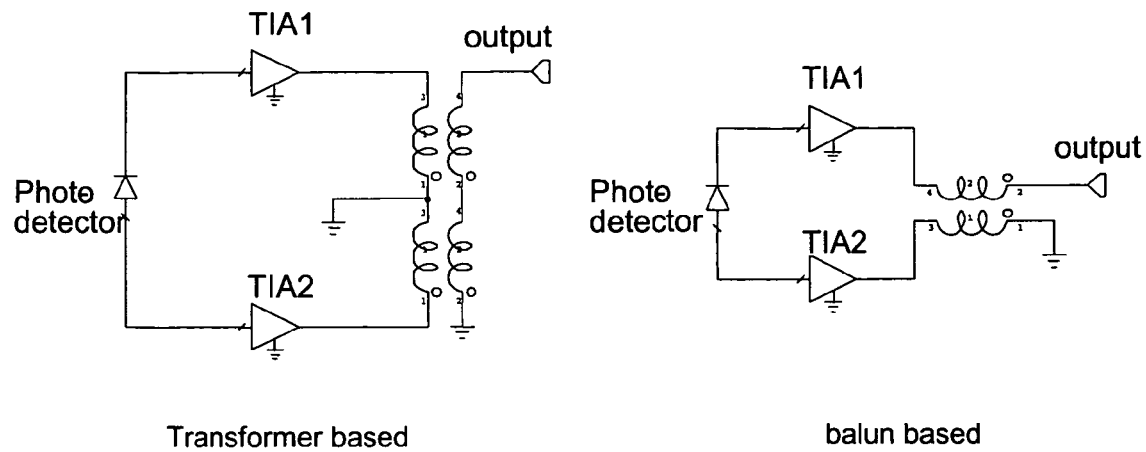
FIG. 3 is a schematic of a prior art push-pull topology in which two separate amplifiers are operated 180 degrees out of phase.
Figure 4:
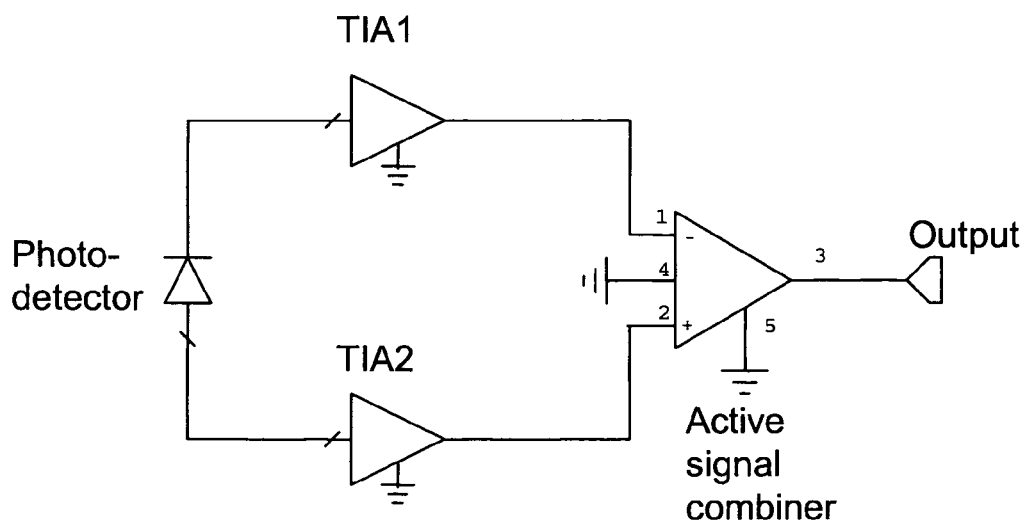
FIG. 4 is a schematic of a prior art circuit that combines signals in an active differential amplifier.
Figure 5:
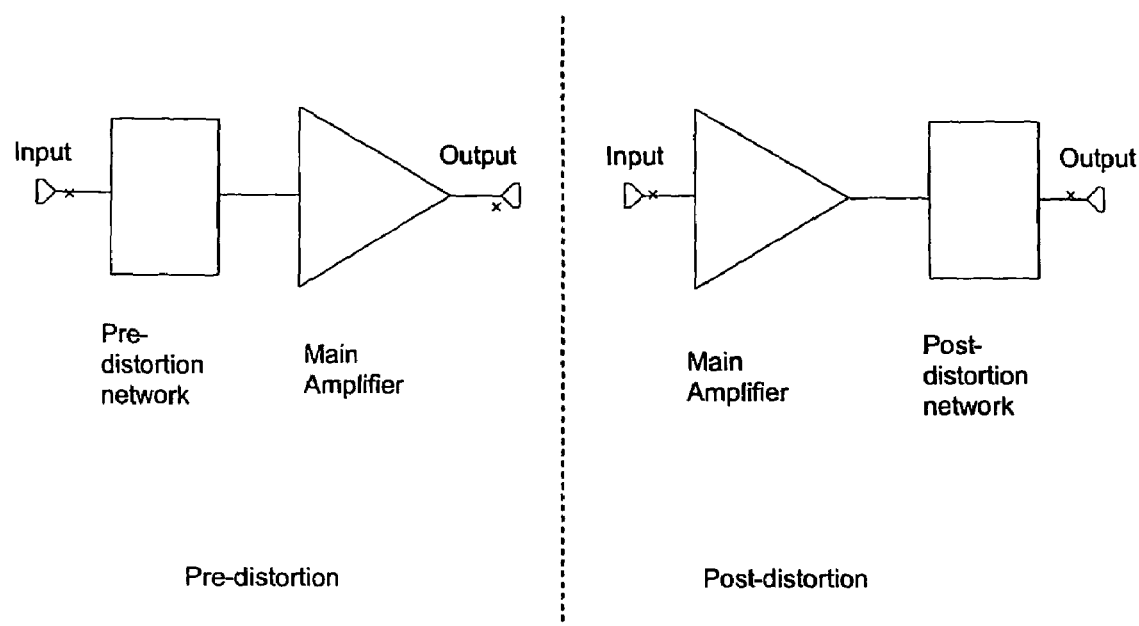
FIG. 5 is a block diagram illustrating pre-distortion and post-distortion linearization.

Linearization can be broken into two primary types, pre-distortion and post-distortion, as shown in FIG. 5. In pre-distortion, the gain re-alignment is performed by placing a dynamically varying network on the input of the amplifier. As the input signal level varies, the pre-distortion network adjusts its gain or loss characteristics in a way that is opposite of the anticipated main amplifier's characteristics. Typically the pre-distortion network's loss decreases with increasing signal level, which has the desirable effect of compensating for the main amplifier's decrease in gain with increasing signal level. Pre-distortion often involves varying the loss on the input side of a main amplifier, which implies some steady state amount of loss is present. As applied to an optical receiver, this extra loss is undesirable as it implies degraded noise performance.

A post-distortion approach is also shown in FIG. 5. In post-distortion compensation, the gain re-alignment is performed placing a dynamically varying network on the output of the amplifier. As the output signal level from the main amplifier varies, the post-distortion network adjusts its gain or loss characteristics in a way that is opposite of the main amplifier's characteristics. Typically, the post-distortion network's loss decreases with increasing signal level, which has the desirable effect of compensating for the main amplifier's decrease in gain with increasing signal level. Post-distortion often involves varying the loss on the output side of a main amplifier, which implies some steady state amount of loss is present. This implies an amount of signal level is lost at the output of the main amplifier, which degrades the power efficiency of the combined amplifier. Power efficiency is a major concern for wireless applications, such as base-station power amplifiers, but as applied to optical receivers, this extra loss is much less of an issue since the power levels are much smaller. In a linear optical receiver, distortion performance over the full optical dynamic range is of greater concern. A small power penalty imposed by post-distortion is of much less significance than the noise penalty that would be imposed by pre-distortion.

Figure 6:
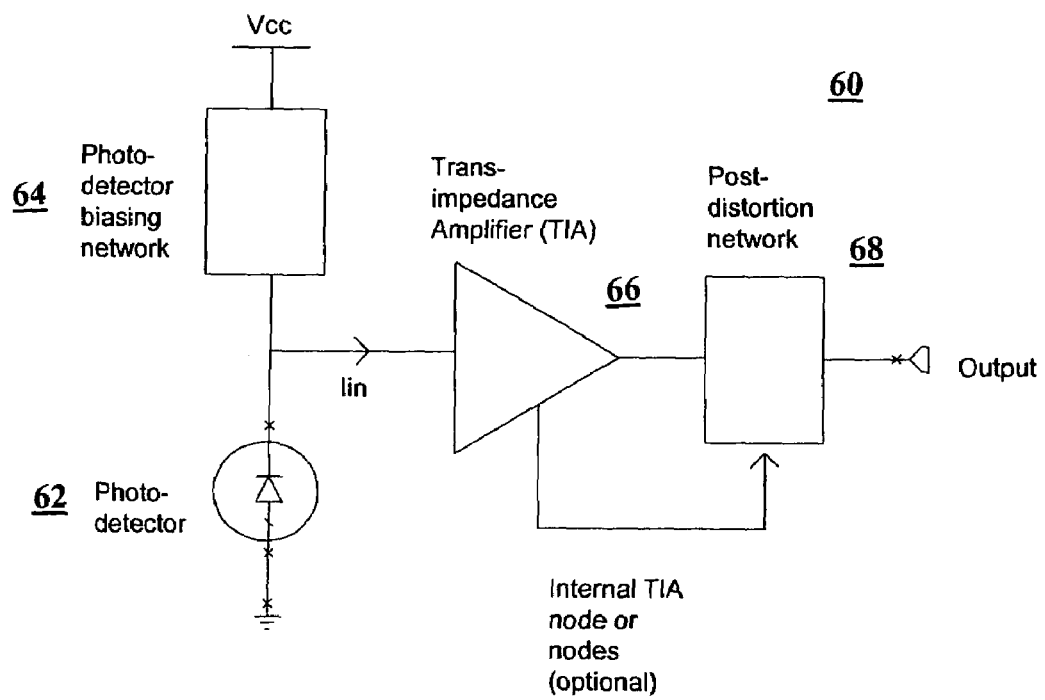
FIG. 6 is a block diagram of one embodiment of the present invention.

Accordingly, the present invention, as shown in one embodiment in FIG. 6, is a post-distorted optical receiver 60. It consists of a photo-detector 62, photo-detector biasing circuit 64, a trans-impedance amplifier 66, and a post-distortion network 68. When reverse biased by the biasing network 64, the photo-detector 62 generates a current, Iin, proportional to incoming light intensity that demodulates AM information. This current drives the trans-impedance amplifier 66. The photo-detector biasing network 64 may be a single resistor or inductor, or network which provides a high impedance interface to the anode and cathode of the photo-detector 62. The trans-impedance amplifier 66 has been designed to achieve a balance between low noise and low distortion over the full optical dynamic range.

The trans-impedance amplifier 66 may provide two signals to the post-distortion network 68. First, it optionally provides internal node or nodes to the post-distortion network 68. These node or nodes are brought from the trans-impedance amplifier 66 and are used to indicate to the post-distortion network 68 the internal condition of the trans-impedance amplifier 66. At key locations inside the trans-impedance amplifier 66, useful information is present which indicates the state of the trans-impedance amplifier 66 as it dynamically varies with changing input signal levels. The post-distortion block 68 takes in these nodes and uses the information contained therein to adjust its own gain or loss characteristics. The use of these internal trans-impedance nodes is not mandated by the invention, but may be used if desired.

In one embodiment, such nodes need not be available, since they are contained within an integrated circuit with no external access. In another embodiment, access to such nodes is available as the invention is embedded into an integrated circuit with electrical leads from the node or nodes.

The post-distortion network 68 of the invention exists to re-align the gain characteristic of the trans-impedance amplifier 66. As the input light signal varies, the trans-impedance amplifier's gain will not be constant. The post-distortion network 68 exists to correct for this gain error, such that the composite output voltage is linear with respect to input current.

The present technique works by having the dynamic gain responses of the trans-impedance amplifier 66 and that the post-distortion network 68, as measured at the output of the receiver, equal in magnitude and opposite in phase. For instance, if the trans-impedance gain decreases with increasing photodetector current, then the post-distortion network's gain must increase, or alternatively its loss must decrease. If the trans-impedance amplifier's gain increases with increasing photodetector current, then the post-distortion network's gain must decrease, or alternatively, its loss must increase.

The benefits of the invention are twofold. First, a lower distortion optical receiver results from the cancellation of the trans-impedance amplifier's distortion and that of the post amplifier. Because optical systems are designed with a fixed distortion budget in mind, an improvement in the distortion characteristics of the receiver will permit a higher optical input condition to be tolerated before the distortion budget is exceeded. The invention may also be used to increase the optical dynamic range by extending the upper end of the permissible optical operating range.

Second, the present invention's improved distortion may be used as design margin in the trade-off between noise and distortion. For example, the primary source of noise is the primary shunt feedback resistor. It is also the primary determinant of the output level from the receiver. An improvement in distortion by utilizing the post-distortion technique will allow the designer to increase the value of the feedback resistor, which will in turn improve the noise. The present invention thus enables improved noise performance by allowing critical sources of noise to be favorably altered without the aforementioned distortion penalty. The improvement in noise performance leads to an extension in optical dynamic range because the receiver can operate with acceptable signal quality with a smaller amount of incoming light. The invention can thus be used to increase the optical dynamic range of the receiver by reducing the lower end of the permissible optical operating power range.

Figure 7:
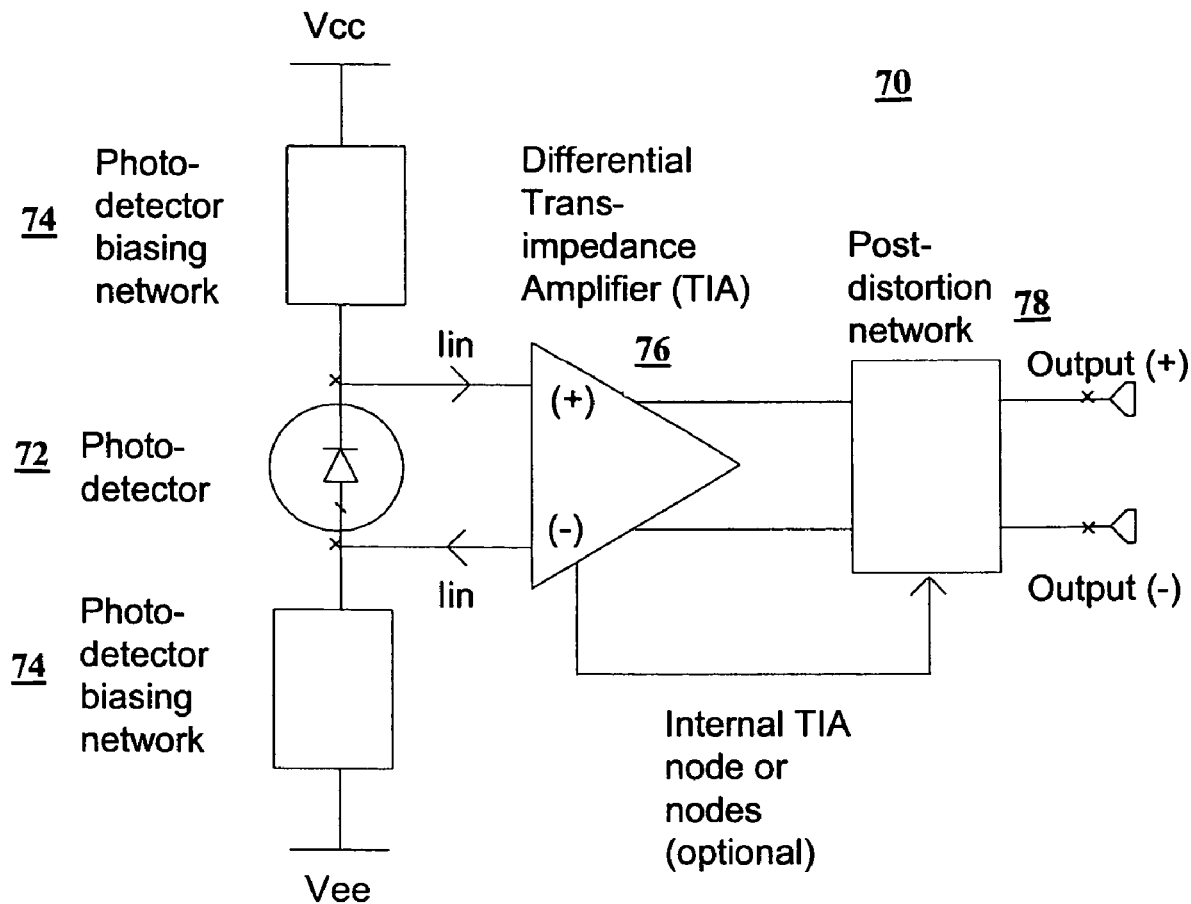
FIG. 7 is a block diagram of another embodiment of the present invention.

The present invention may be extended to differential implementations as shown in FIG. 7. Two biasing networks 74 provide high impedance connections between the cathode and a positive supply, and between the anode to a more negative supply. In this embodiment, both polarities of the photo-detector 72 drive a single differential trans-impedance amplifier 76 having two inputs and two outputs. The two outputs of the differential trans-impedance amplifier 76 drive a post distortion network 78 itself comprising two inputs and two outputs. In the same manner as previously described, the post-distortion network 78 compensates for gain variations of the differential trans-impedance amplifier 76 such that the relationship between the input current, denoted Iin, and the output voltage, which is the difference between output (+) and output (−) in FIG. 7, remains linear over the full input optical dynamic range.

Figure 8:
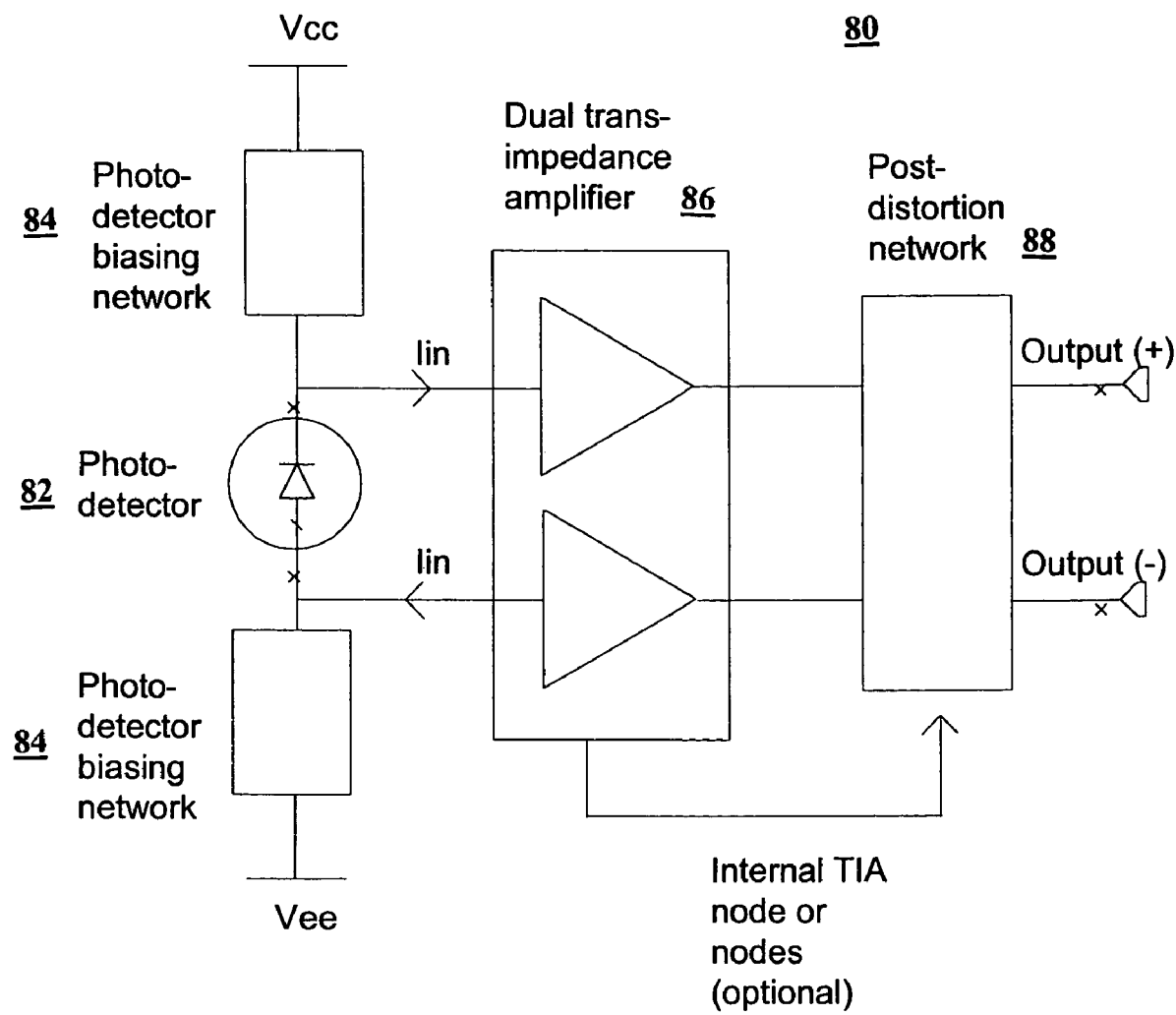
FIG. 8 is a block diagram of another embodiment of the present invention.

The present technique may also be applied to receivers using a dual trans-impedance amplifier as shown in FIG. 8. In this case, there are two trans-impedance amplifiers 86 which for cost savings may easily be fabricated onto a single integrated circuit. The circuit in FIG. 8 may be designed without regard for the complexities associated with differential circuit parameters, such as common-mode rejection performance. Provided the amplifiers 86 are matched and the input current from the photo-detector 82 is balanced, the two amplifier approach in FIG. 8 operates with the same benefits as the circuit in FIG. 7.

Figure 9:
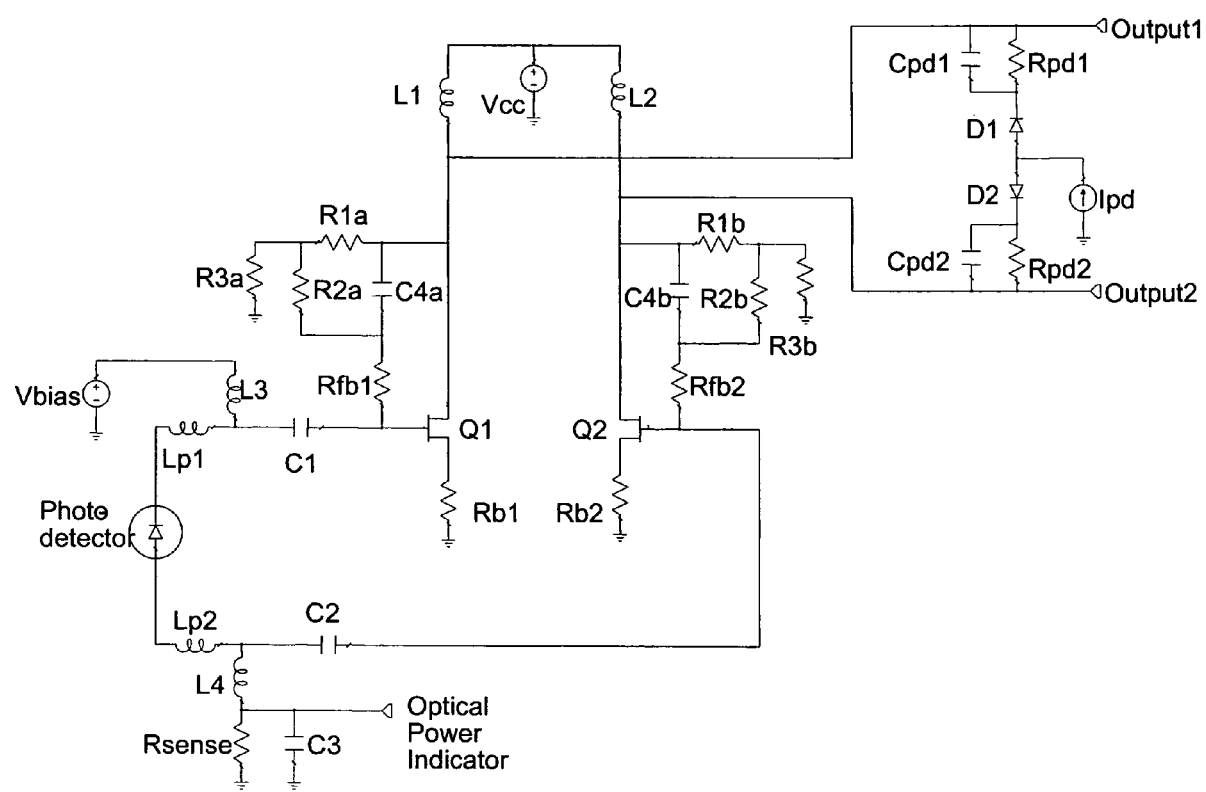
FIG. 9 is a detailed schematic according to one embodiment of the present invention.

A detailed schematic of one embodiment of the present invention is shown in FIG. 9. Both outputs of a photo-detector drive the two inputs of two separate trans-impedance amplifiers based upon transistors Q1 and Q2 respectively. Biasing inductors L3 and L4 provide a mechanism for a voltage source, Vbias, to reverse bias the photo-detector. The inductors L3 and L4 maintain a high impedance to the photo-detector so valuable current has limited opportunity to be diverted into the biasing path. Peaking inductors, L1 and Lp2, mitigate the parasitic capacitance of the photo-detector, and help improve the impedance matching which the differential trans-impedance amplifier sees looking back into its driving source. Capacitors C1 and C2 provide AC decoupling such that any DC current drawn by the photo-detector will build up a voltage across Rsense. Optical power can be determined by reading the voltage across Rsense. Transistors Q1 and Q2 form the core of the trans-impedance amplifiers and are shown as field-effect-transistors (FETs), but without loss of generality other technologies may be used, such as bipolar junction transistors (BJTs).

In small signal operation, an AC voltage appearing at the gates of transistors Q1 and Q2 respectively generate AC drain currents. These drain currents will work against the impedance presented to the drains of transistors Q1 and Q2, which is largely dependent on the output loading of the circuit, to generate an AC voltage on the drains of transistors Q1 and Q2. The AC drain voltages of transistors Q1 and Q2 are passed through capacitors C4$a$ and C4$b$ and generate a feedback current through resistors Rfb1 and Rfb2. These two resistors, Rfb1 and Rfb2, are the primary resistors to set the noise and gain performance of the circuit. Larger values of resistors Rfb1 and Rfb2 will produce higher trans-impedance gain, and the corresponding improved noise performance, but at expense of higher distortion from transistors Q1 and Q2 since the drain voltages will also be increased with the higher gain. Typical values for Rfb1 and Rfb2 are in the range of 700 to 1400 ohms.

Biasing of transistors Q1 and Q2 is performed by generating a small positive voltage from resistive voltage dividers off the drains of Q1 and Q2 using resistors R1a, R3a, R1b, and R3b. The DC current flow into the gates of Q1 and Q2 is extremely low, such that a small positive voltage is presented to the gates of Q1 and Q2. The bias current flowing in Q1 and Q2 is set by this small voltage in conjunction with the device characteristics and the value of resistors Rb1 and Rb2. Relevant device characteristics are pinch-off voltage, Vp, which is the gate voltage needed to completely turn off the device, and saturated drain current, Idss, which is the current flow when Vgs=0. Typically the gate voltage is set to a small quantity to preserve voltage headroom in the circuit. Should the gate voltage be designed to be a large level, the resulting source voltage will also be large. In this case, valuable voltage headroom will be lost to the circuit, which will result in degraded efficiency and linearity performance because power is consumed in the biasing resistors. In addition, FET device linearity can generally be improved by increasing the biasing condition from drain to source. Best efficiency and linearity results by minimizing the voltage at the sources of Q1 and Q2 respectively. The values of Rb1 and Rb2 are generally very small, typically less than 5 ohms, to preserve headroom while still generating enough biasing voltage for the gates of Q1 and Q2.

With no major changes in performance, it is possible to tie the sources of Q1 and Q2 together and combine resistors Rb1 with Rb2. The resulting circuit still operates like two amplifiers because the small value of resistance Rb1 and Rb2 needed to properly set the drain currents together is too small to be of use in generating common-mode rejection. Such common-mode rejection is best achieved with a current source in place of Rb1 and Rb2, but at significant expense of the aforementioned voltage headroom.

The present embodiment overcomes the drawback introduced by a larger value of Rfb1 and Rfb2 by applying post distortion across the drains of Q1 and Q2 as shown in FIG. 9. The post-distortion network comprises D1 and D2, which are diodes with highly non-linear relationship between the voltage across their terminals, Vd, and resulting current flow, Id:

$$Id=Is*exp(Vd/Vt)$$

where Is and Vt are constants that describe the diodes behavior and are based on the material properties, size, and fabrication of the diode. One can differentiate Id with respect to Vd to obtain the dynamic diode resistance, Rd:

$$Rd=d(Vd)/d(Id)=Vt/Id$$

The expression for Rd indicates that the dynamic resistance of the diode drops as the current through the diode increases. Referring back to the post-distortion network in FIG. 9, the diodes D1 and D2 are biased with a DC amount of current determined by Ipd, which sets their steady-state resistance, which can be thought of as the amount of resistance in the circuit when the input level is small and the steady state amount of loss appears on the output of the trans-impedance amplifier. As the input level is increased, the voltages of the drains of Q1 and Q2 respectively will increase, which leads to an increase in the voltage across D1 and D2 and an increase in the AC current flowing through D1 and D2. The diodes D1 and D2 are connected in an anti-series connection. The increase in current flow through D1 and D2 causes one of them to turn on harder, but due to the anti-series connection, causes the other to conduct less. The diode that is turned on harder will have a lower dynamic resistance, while the diode conducting less will have a higher dynamic resistance. The exponential relationship of the diode leads to the property that the sum of the dynamic resistances of the diode conducting more and the diode conducting less will be larger than the steady state resistance of the pair. In other words, the diode turning off adds more resistance to the anti-series pair than the diode turning on takes out. In this way the anti-series dynamic resistance is increased when the voltage across the outputs is increased, and the amount of loss which the post-distortion network presents to the outputs decreases. This results in what appears as gain expansion, which is able to compensate for gain compression of the trans-impedance amplifier.

The resistors Rpd1 and Rpd2 help control the amount of non-linearity generated by D1 and D2 appearing in the output. Along with the bias current, Ipd, they are the primary means for aligning the non-linearity of the post-distortion circuit with the non-linearity of the trans-impedance amplifier. A higher value of Ipd and Rpd leads to a more linear post-distortion network, which is suitable when a comparatively linear trans-impedance amplifier is used. When generating third-order non-linearities on the order of a third order intercept (TOI) of approximately 35 dBm, typical values for Ipd and Rpd are 2 mA and 300 ohms respectively. The capacitors Cpd1 and Cpd2 are useful to control the phase of the post-distortion signal; and typical values are 0.3 pF.

Figure 10:
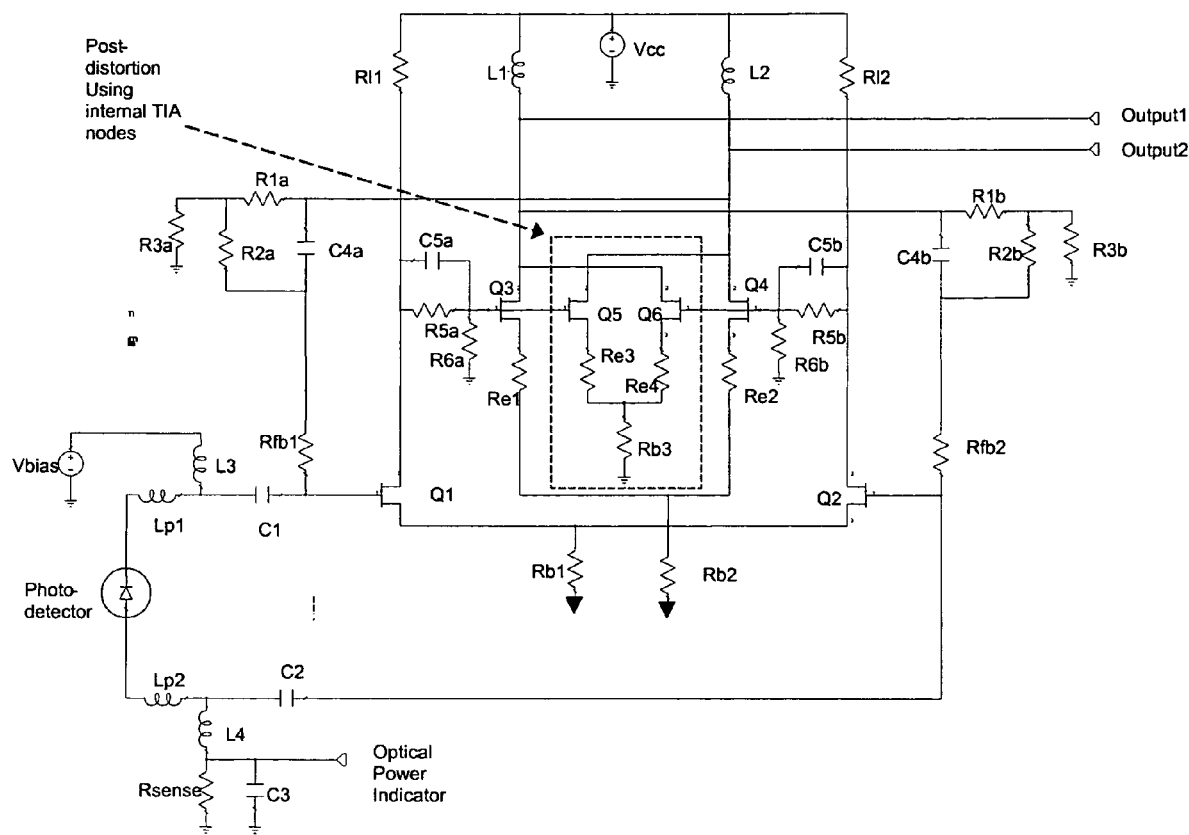
FIG. 10 is a detailed schematic of an additional embodiment of the present invention.

An alternate differential embodiment of the invention is shown in FIG. 10. Unlike the embodiment of FIG. 9, the circuit in FIG. 10 makes use of internal trans-impedance amplifier nodes in the post-distortion block. The trans-impedance amplifier in this embodiment is a two-stage amplifier. The input stage is formed by Q1 and Q2, and the output stage is formed by Q3 and Q4. Because the two-stage design has two phase reversals, negative feedback is accomplished by cross-coupling the output feedback resistor, Rfb, from the opposite drain in the differential pair to the gate. This can be seen in that the gate of Q1 is connected to the drain of Q4, which is the opposite side of the output, through Rfb1 and C4a. In this approach, negative feedback is maintained because output amplifier is essentially a non-inverting stage.

The additional gain from this two-stage approach to the trans-impedance amplifier provides a number of benefits. First, the higher gain lowers the input impedance of the circuit without a reduction in the feedback resistor which would cause degradation in noise performance. Although the higher voltage gain of the two-stage design does not affect the trans-impedance gain, it does produce smaller input impedance. Because the trans-impedance gain is determined by the feedback resistors and not the voltage gain of the two-stage amplifier, the output voltages are essentially constant with variations in the voltage gain of the two-stage amplifier. However, the higher the voltage gain of the two-stage amplifier, the lower the voltage must be across the input terminals. With the input current held constant, a larger two-stage voltage gain will reduce the input voltage, which indicates that the input impedance is lower because a lower input voltage is developed at the input terminals. A lower input impedance is very desirable because it extends the pole formed by the photodetector capacitance and the input impedance, which is often the dominant cause of frequency roll-off in the receiver.

The post-distortion circuit is formed by transistors Q5 and Q6, operating as a differential pair. The transistors Q5 and Q6 are typically a small fraction of the size and bias as compared to the primary output devices Q3 and Q4. The inputs to the post-distortion network are the gate voltages of Q3 and Q4, which are internal nodes from the trans-impedance amplifier. Because the drains of Q5 and Q6 are cross-coupled to the drains of Q3 and Q4, the gain of the $2^{nd}$ stage is reduced.

Transistors Q5 and Q6 in FIG. 10 can be thought of as current thieves from the primary output devices Q3 and Q4, which are the primary causes of distortion in the receiver. The non-linearities of Q3 and Q4 will result in a gain characteristic which reduces with an increase in drive level. Proper choice of circuit values associated with Q5 and Q6 allows the gain compression of Q5 and Q6 to steal less current from the output. As in the case of the diode-based post-distortion of FIG. 9, the circuit in FIG. 10 works by having the post-distortion network remove less gain as the input level increases. The gain compression characteristics of the post-distortion network are determined by the sizes of Q5 and Q6, the amount of degeneration Re3 and Re4 appearing in the sources of Q5 and Q6, and the amount of bias current set by the tail resistor Rb3.

The design in FIG. 10 is fabricated using a 0.25 micron GaAs Pseudomorphic High Electron Mobility Transistor (PHEMT) process. The post-distortion block has been shown to reduce $3^{rd}$ order distortions by more than 10 dB, which provides meaningful design margin to then increase the value of Rfb. In the design, Rfb is over 1600 ohms, which according to the formula for noise from a resistor previously discussed, causes 3.16 pA/rtHz of noise in a single ended design, or 2.23 pA/rtHz in a push-pull design like the present invention. Full simulation, inclusive of all noise sources, shows the total equivalent input noise to be less than 2.5 pA/rtHz and the output $3^{rd}$ order intermod intercept point, (IP3), as above 40 dBm. The increased IP3 is a result of the post-distortion network's effectiveness and is necessary to support the higher gain introduced by the much larger Rfb.

The level of noise performance achieved here is believed to be the lowest reported for such a linear receiver operating over the common cable television range of frequencies, 50 MHz to 870 MHz. The results show excellent equivalent input noise of less than 2.5 pA/rtHz. Prior to the present invention, the state-of-the-art noise performance was believed to be around 4 pA/rtHz, so the present invention significantly improves the sensitivity of the receiver. This level of performance enables the receiver to be operated with a reduced amount of incident light, which increases the optical dynamic range.

The embodiment shown in FIG. 10 can be easily integrated into a single radio-frequency-integrated-circuit (RFIC). For flexibility in setting bias currents and aligning the gain compression characteristics of the Q3 and Q4 pair against the Q5 and Q6 pair, biasing resistors Rb2 and Rb3 can be brought outside the RFIC for design flexibility.

Biasing of the devices in FIG. 10 is accomplished with resistors R11, R12, R5a, R5b, R6a, R6b, R1a, R1b, R3a, and R3b, which form an active bias network to stabilize bias currents against process and temperature variations. As before, the values of Rb1 and Rb2 are small, typically a few ohms, to preserve voltage headroom and are the primary determinants in setting currents.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An optical receiver comprising:
   a photodetector;
   a photodetector biasing network connected to the photodetector;
   a trans-impedance amplifier having an input connected to the photodetector; and
   a post-distortion network connected to an output of the trans-impedance amplifier, and at least one internal node of the trans-impedance amplifier is connected to the post distortion network to provide at least one input signal for the post-distortion network to adjust a gain or loss characteristic of the post-distortion network;
   wherein the post-distortion network compensates for gain error in the trans-impedance amplifier, such that a composite output voltage is relatively linear with respect to input current, and wherein the dynamic gain responses of the amplifier and the post-distortion network are equal in magnitude and opposite in phase.

2. The optical receiver of claim 1, wherein the trans-impedance amplifier comprises a differential trans-impedance amplifier having two inputs and two outputs, and the distortion network has two inputs connected to the two outputs of the differential trans-impedance amplifier.

3. The optical receiver of claim 1 wherein the trans-impedance amplifier comprises a dual trans-impedance amplifier having two inputs and two outputs, and the distortion network has two inputs connected to the two outputs of the dual trans-impedance amplifier.

4. A method for increasing the dynamic range of an optical receiver, the method comprising:
   detecting an optical signal with a photodetector, the photodetector biased with a biasing network;
   applying an output current from the photodetector to a trans-impedance amplifier;
   applying an output signal from the trans-impedance amplifier to a post-distortion network; and
   applying a signal from at least one internal node of the trans-impedance amplifier to the post-distortion network to provide at least one input signal for the post-distortion network to adjust a gain or loss characteristic of the post-distortion network;
   wherein the post-distortion network compensates for gain error in the trans-impedance amplifier, such that a composite output voltage is relatively linear with respect to input current, and wherein the dynamic gain responses of the trans-impedance amplifier and the post-distortion network are equal in magnitude and opposite in phase.

* * * * *